Figure 1:
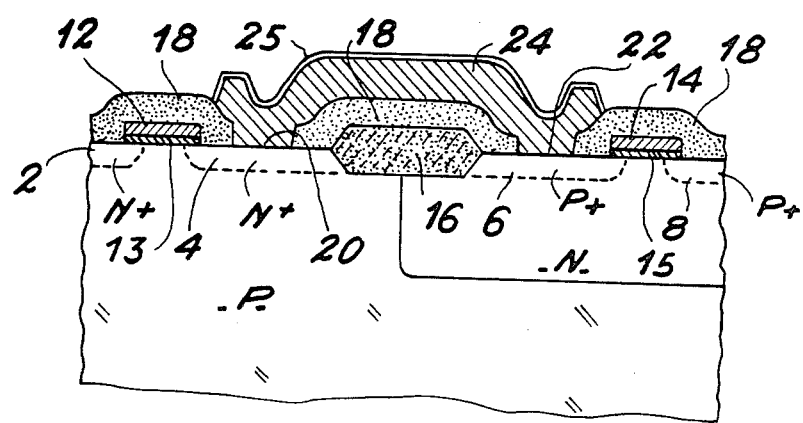

United States Patent [19]

Deneuville et al.

[11] Patent Number: 4,777,150

[45] Date of Patent: Oct. 11, 1988

[54] PROCESS FOR THE FORMATION OF A REFRACTORY METAL SILICIDE LAYER ON A SUBSTRATE FOR PRODUCING INTERCONNECTION

[75] Inventors: Alain Deneuville, St Egreve, France; Pierre Mandeville, Montreal, Canada

[73] Assignee: Centre de La Recherch Scientifique, France

[21] Appl. No.: 833,823

[22] Filed: Feb. 26, 1986

[30] Foreign Application Priority Data

Mar. 1, 1985 [FR] France .................. 85 03042

[51] Int. Cl.$^4$ .................. H01L 21/283; H01L 21/265
[52] U.S. Cl. .................. 437/200; 437/245; 437/192; 437/238; 437/20; 148/DIG. 1; 148/DIG. 83
[58] Field of Search .................. 29/590, 591; 427/83, 427/87, 89, 93; 357/65, 71; 437/192, 193, 200, 178, 20, 238, 245

[56] References Cited

U.S. PATENT DOCUMENTS

| | | | |
|---|---|---|---|
| 3,771,026 | 11/1973 | Asai et al. | 317/234 R |
| 4,128,670 | 12/1978 | Gaensslen | 427/86 |
| 4,263,058 | 4/1981 | Brown et al. | 437/200 |
| 4,265,935 | 5/1981 | Hall | 427/89 |
| 4,337,476 | 6/1982 | Fraser et al. | 437/200 |
| 4,339,869 | 7/1982 | Reihl et al. | 437/200 |
| 4,529,619 | 7/1955 | Nemanich et al. | 427/86 |

FOREIGN PATENT DOCUMENTS 0055161 6/1982 European Pat. Off. .

OTHER PUBLICATIONS

Silvermith et al., "Oxide Barriers to the Formation of Refractory Metal Silicides", in *Thin Solid Films*, 93 (1982) 413–419.

Tsaur et al., "Appl. Phys. Lett. 35(3), Aug. 1979, pp. 225–227.

Ghandhi, S. K., VLSI Fabrication Principles, John Wiley & Sons, 1983, pp. 430–439.

ASM Committee on Heat-Resisting Alloys, *Metals Handbook*, vol. 2, 8th Ed., (Edited by T. Lyman et al.,), pp. 257–259, American Society for Metals, Ohio, 1964.

K. N. Tu et al., *Thin Films-Interdiffusion and Reactions*, (Edited by J. M. Poate et al), pp. 370–375, John Wiley & Sons., New York, NY 1978.

*Primary Examiner*—Brian E. Hearn
*Assistant Examiner*—T. N. Quach
*Attorney, Agent, or Firm*—Nutter, McClennen & Fish

[57] ABSTRACT

There is described a process for the formation on a substrate of a refractory metal silicide layer, usable particularly for producing the interconnection layers of integrated circuits. This process consists of successively depositing on the substrate a first amorphous hydrogenated silicon layer, a second amorphous hydrogenated refractory metal layer, e.g. of tungsten, titanium, molybdenum or tantalum, and a third amorphous hydrogenated silicon layer. The thus coated substrate is then subjected to an annealing treatment at a temperature equal to or higher than 350° C. in a hydrogen atmosphere. Preferably, following the deposition of the three layers, the coated substrate undergoes ionic implantation, e.g. using tungsten ions, for producing defects in the layers, which makes it possible to speed up the formation of the refractory metal silicide layer during the annealing stage.

13 Claims, 2 Drawing Sheets

PROCESS FOR THE FORMATION OF A REFRACTORY METAL SILICIDE LAYER ON A SUBSTRATE FOR PRODUCING INTERCONNECTION

BACKGROUND OF THE INVENTION

The present invention relates to a process for forming a refractory metal silicide layer. It more particularly applies to refractory metals having a melting point above 1400° C., e.g. metals of groups IVa, Va, VIa of the periodic classification of elements, such as Ti, Zr, Hf, V, Nb, Ta, Cr, Mo and W. More specifically, it relates to the production of interconnection layers for the manufacture of integrated circuits.

In the field of microelectronics and more particularly that of silicon integrated circuits using bipolar or MOS transistors, it is necessary to interconnect the elementary devices, while also connecting them to other components of the circuit and external supply means, this being carried out by means of conductive films called interconnection layers.

Hitherto, these interconnection layers have been made from aluminum, which is highly conductive, but suffers from the disadvantage of reacting with silicon, even when the latter is in $SiO_2$ form for forming aluminum silicon alloys.

In connection with the miniaturization of circuits, the lateral sizes of components have been reduced to permit the placing of a larger number of components on the same circuit. Therefore the thickness of these various films has decreased and the problem of the interconnection layers reacting with the silicon has become more serious.

In order to prevent these interactions, there have been inserted between the aluminum and the compounds containing silicon layers acting as diffusion barriers and which are, e.g., made from chromium or tungsten.

In order to bring about a better alignment of the source and drain of a MOS transistor, use has also been made of a highly doped polycrystalline silicon gates for bringing about the self-alignment. Thus, aluminum has been progressively replaced by highly doped polycrystalline silicon, but this silicon suffers from the disadvantage of not being sufficiently conductive.

Thus, present research is directed towards the use of new materials, such as refractory metal silicides, for producing interconnection layers and for shunting the gate polycrystalline silicon. Thus, silicides of refractory metals are of interest because they are stable at the high temperatures used during the heat treatments involved in the production of integrated circuits and they have a high electrical conductivity. These silicides can be formed at high temperature by thermal growth from a metal layer deposited on polycrystalline silicon However the use of high temperatures is prejudicial, because they modify the physicochemical and electronic characteristics of the other layers and components already formed on the integrated circuit.

It is also possible to form such silicide films by the co-evaporation of two elements, e.g. silicon and tungsten, under a high vacuum ($10^{-7}$ Torr), followed by an annealing treatment at 1000° C. under a hydrogen atmosphere, as described in Appl. Phys. Lett, 33(1), 1978, pp 76-78. However, this process suffers because it does not obtain a yield high enough for the deposition.

It is also possible to form such films by subjecting a refractory metal film deposited under an ultravacuum on a silicon substrate to hot ionic implantation of $As^+$, followed by an annealing treatment, in the manner described in Appl. Phys. Lett, 37(1), 1980, pp. 295-298. However, this process also suffers from the disadvantage of requiring high vacuums. In addition, it is necessary to have high implantation currents (1.5 $\mu A.cm^{-2}$) and it is necessary to carry out simultaneous heating (350° C.) to obtain the silicide layer.

Attempts at manufacturing refractory silicides at lower temperatures have not as yet been made due to the fact that the silicide formation is blocked by the presence of oxygen traces, as indicated by D. J. Silversmith, D. D. Rathman and R. W. Mountain in "Thin Solid Films" Vol. 93, p. 413, 1982.

SUMMARY OF THE INVENTION

The present invention relates to a process for the formation of a refractory metal silicide layer on a substrate not requiring the use of high temperatures and which can easily be carried out on an industrial scale.

Thus, the present invention specifically relates to a process for the formation on a substrate of a refractory metal silicide layer, wherein it comprises the following successive stages:

(a) depositing on said substrate a first hydrogenated amorphous silicon layer, (b) depositing on said first layer a second amorphous hydrogenated refractory metal layer, (c) depositing on said second layer a third hydrogenated amorphous silicon layer and, (d) subjecting the thus obtained coated substrate to an annealing treatment at a temperature equal to or higher than 350° C. in a hydrogen atmosphere.

As stated hereinbefore, the refractory metal is a metal with a melting point higher than 1400° C., e.g. a metal in groups IVa, Va or VIa. Preference is given to the use of tungsten, tantalum, titanium or molybdenum.

The use, according to the inventive process, of two amorphous hydrogenated metal layers between which is arranged an amorphous hydrogenated refractory metal layer makes it possible to obviate the problems of silicide formation linked with the presence of oxygen traces. Thus, for depositing the hydrogenated layers, it is necessary to operate in the presence of hydrogen, which makes the deposition medium highly reductive and makes it possible to saturate with hydrogen the free surfaces of the silicon and refractory metal layers. This prevents the formation of a native oxide in contact with the air, the presence of oxygen inhibiting the formation of the refractory metal silicide. It is not, therefore, necessary to maintain the substrate under a vacuum between each deposition operation which facilitates the performance of the process.

Moreover, the use of amorphous M refractory metal with a more open structure, i.e. weaker M-M bonds, also containing structural defects, makes it possible to facilitate the diffusion of silicon into the refractory metal during the annealing heat treatment leading to the formation of the refractory metal silicide.

In the same way, the use of amorphous silicon with weaker Si-Si bonds, facilitates from the outset the separation of the silicon atoms which will diffuse towards the refractory metal.

According to a preferred embodiment of the inventive process, there is a complimentary stage consisting of subjecting at least one selected area of the substrate coated with the three layers to ionic implantation before carrying out annealing stage d above. The ions used for this implantation can be refractory metal ions, silicon ions or ions of an element not reacting either with the refractory metal or with the silicon, e.g. xenon or krypton.

This implantation makes it possible to produce supplementary defects in the amorphous hydrogenated silicon layers and in the amorphous hydrogenated refractory metal layer, which, in turn, makes it possible to obtain a much higher diffusion rate of the silicon atoms and the metal atoms and to consequently form much more rapidly the refractory metal silicide layer.

Moreover, it is possible to carry out the ionic implantation over only certain areas of the substrate, which in turn makes it possible to form the silicide layer only over the substrate areas which have undergone implantation. This is of interest for producing the interconnection layers of integrated circuits because in this way it is possible to obviate the final stage of etching the refractory metal silicide which leads to certain performance problems.

Thus, as a result of this implantation, during the following annealing stage, the silicide, e.g. tungsten silicide, forms much more rapidly on the implanted areas than on the non-implanted areas, the tungsten silicide formation speed on the implanted areas being approximately 50 to 100 times higher. Therefore, by choosing the annealing treatment duration in an appropriate manner, it is possible to form the tungsten silicide layer solely on the implanted areas. Following this operation, the layers deposited on the areas which have not undergone ionic implantation, are eliminated using conventional process. These layers, which are constituted by silicon and tungsten, are much easier to eliminate than tungsten silicide.

Reactive cathodic sputtering is advantageously used for the deposition of the various layers. Thus, the first amorphous hydrogenated silicon layer can be deposited by the reactive cathodic sputtering of a silicon target in the presence of hydrogen by, e.g., using a gaseous mixture formed from hydrogen and an inert gas such as argon, the hydrogen proportion in the mixture possibly rising to 40%.

In general, working takes place at a temperature between 30° and 350° C. by using high frequency diode cathodic sputtering equipment and the deposition conditions are chosen so as to obtain a deposition rate exceeding 20 Å per minute. Cathodic sputtering can also be carried out by using conventional magnetron equipment, which makes it possible to operate at higher formation rates.

It is also possible to deposit the amorphous hydrogenated silicon by the decomposition of a silane present in a gaseous mixture of silane and hydrogen by glow discharge. The gaseous mixtures used generally contain 10 to 100% of silane, such as $SiH_4$ and working preferably takes place at a temperature of 30° to 350° C.

The deposition of the third amorphous hydrogenated silicon layer can be carried out in the same way as that of the first layer, e.g. by reactive cathodic sputtering using a mixture of argon and hydrogen, but preferably at a lower temperature, e.g., at ambient temperature, by choosing the deposition conditions in such a way as to obtain a low deposition rate.

The second amorphous hydrogenated refractory metal layer can be deposited by reactive cathodic sputtering in the presence of hydrogen by using a gaseous mixture of hydrogen and a rear gas such as argon containing up to 40% of hydrogen. Working preferably takes at ambient temperature and the deposition conditions are chosen in such a way as to obtain a very low deposition rate, e.g. approximately 15 Å per minute. This hydrogenated refractory metal layer could also be formed by using other processes, e.g. reactive evaporation and thermal or plasma-assisted decomposition of a gas or gaseous mixture containing the refractory metal and hydrogen.

When performing the process according to the invention, the temperature used for the annealing treatment is more particularly chosen as a function of the nature of the refractory metal used.

Thus, the temperature must be adequate to obtain recrystalization of the silicide layer with an increase in the size of the crystallites and a reduction in the residual defects in each crystallite. Moreover, it is preferably done so that during the annealing treatment, there is a segregation towards the outer surface of the refractory metal silicide layer of the $SiO_2$ formed from the residual oxygen present in the refractory metal and/or silicon layer and/or at the interface of said layers. This leads to the formation of an isolating $SiO_2$ layer, which covers the outer surface of the refractory metal silicide layer. In order to obtain this result, it is necessary to operate at adequate temperatures and for adequate periods of time dependent on the nature of the refractory metal used, particularly its affinity for oxygen, as well as the residual oxygen quantity present in the layers.

When the refractory metal is tungsten, a temperature is used which is equal to or exceeds 550° C. for forming the tungsten silicide layer covered with an isolating layer of $SiO_2$, e.g. a temperature of 650° C. for 10 hours or a temperature of 750° C. for 1 hour.

When the refractory metal is tantalum, which has a greater affinity for oxygen, it is possible to use lower temperatures, e.g. temperatures equal to or exceeding 400° C. for forming the tantalum silicide layer covered with an isolating layer of $SiO_2$.

This simultaneous formation of a $SiO_2$ layer on the refractory metal silicide layer is of great interest, particularly when the refractory metal silicide layer is to be used as an interconnection layer in an integrated circuit. Integrated circuits are becoming increasingly more complex and it often necessary to form several interconnection levels in such circuits. In this case, they must be isolated from one another and consequently an isolating layer must be formed on each interconnection layer. As a result of the process according to the invention, this can be carried out at the same time as depositing the interconnection layer, which is not the case with the prior art processes.

DESCRIPTION OF THE DRAWING AND PREFERRED EMBODIMENT

The invention is described in greater detail hereinafter relative to an embodiment of the process according to the invention and with reference to the attached drawing in which.

Figure 2:
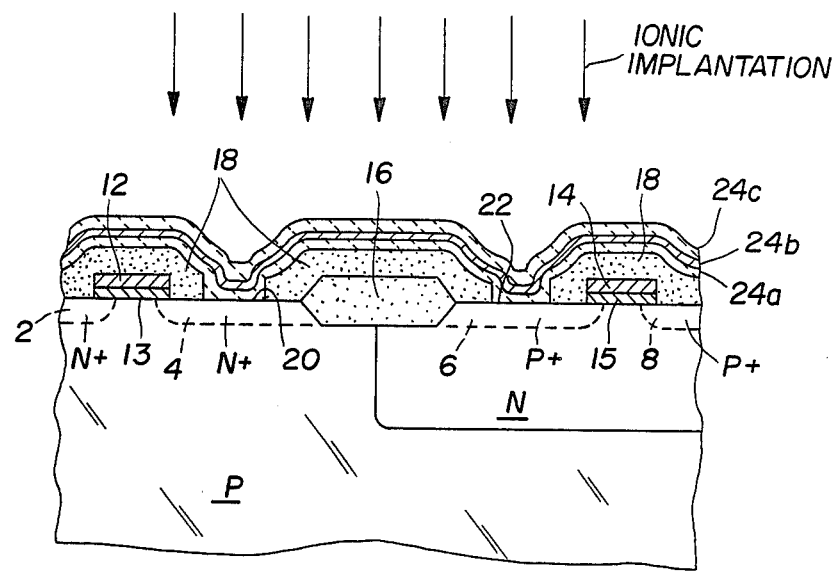
Figure 4:
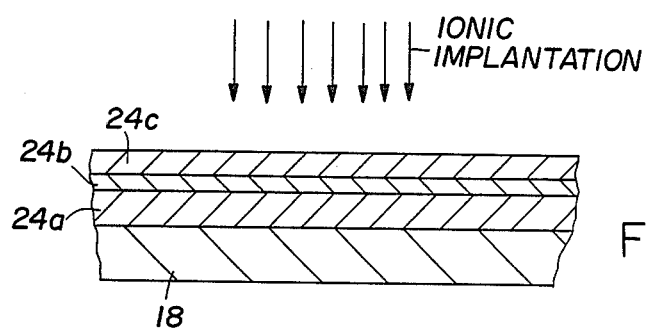
Figure 3:
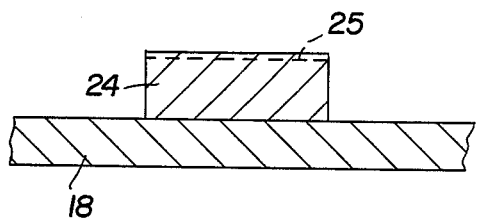

FIG. 1 is a view in longitudinal section of a CMOS inverter illustrating the fitting of a connecting layer made by our process between the active zones of the circuit, FIG. 2 is similar view illustrating the process for making the connecting layer, and FIGS. 3 and 4 are similar views showing the application of a refractory metal silicide layer to a substrate generally.

After producing the components of the integrated circuit, i.e. the active zones such as sources 2 and 8 and drains 4 and 6 of the circuit transistors, gates 12 and 14 of said transistors, the corresponding gate oxides 13 and 15 and the field oxide 16, on the complete integrated circuit is deposited a generally silicon dioxide isolating layer 18. The isolating layer 18 is then etched, to form the electric contact holes such as 20, 22 of the active zones, as well as those of the gates. This is followed by the deposition on the etched isolating layer 18 of a conductive layer and the desired connections are produced, such as the connection or junction 24 between drain 4 of the n channel transistor and drain 6 of the p channel transistor of the inverter and said connection 24 is optionally covered with an isolating layer 25. The process according to the invention is used for forming said connection 24 coated with the isolating layer 25. To this end on the complete substrate (etched oxide layer, as shown in FIG. 2. 18) is deposited a first amorphous hydrogenated silicon layer 24a by reactive cathodic sputtering of a silicon target using a high frequency diode cathodic sputtering apparatus and a gaseous mixture containing 20% hydrogen and 80% argon, while operating under the following conditions:
temperature: 200° C.
exciting beam power: 1.25 W/cm$^2$
deposition rate: 130 Å/min
duration: 4 min
pressure: $8.10^{-3}$ Torr
This leads to a 52 nm thick amorphous hydrogenated silicon layer.

On said first amorphous hydrogenated silicon layer 24a is then deposited a hydrogenated amorphous tungsten layer 24b by the reactive cathodic sputtering of a tungsten target, using a gaseous mixture containing 20% hydrogen and 80% argon and while operating under the following conditions:
temperature: ambient temperature
exciting beam power: 0.35 W/cm$^2$
deposition rate: 15 Å/min
duration: 15 min
pressure: $1.8.10^{-2}$ Torr
This leads to a 22.5 nm thick amorphous hydrogenated tungsten layer.

Following the latter operation a third amorphous hydrogenated silicon layer 24c is deposited by the cathodic sputtering of a silicon target using a gaseous mixture containing 20% hydrogen and 80% argon and while operating under the following conditions:
temperature: ambient temperature
power: 0.625 W/cm$^2$
deposition rate: 30 Å/min
duration: 15 min
This leads to a 45 nm thick amorphous hydrogenated silicon layer.

Following these various operations, the substrate coated with the three layers 24a, 24b, 24c undergoes ionic implantation solely on the zones of the substrate which correspond to the junction 24 to be produced, using tungsten ions and the following implantation conditions:
temperature: ambient temperature
duration: 4 hours
implantation dose: $10^{16}$ atoms/cm$^2$
beam energy: 190 keV
implantation current: 0.1 $\mu$A.cm$^{-2}$ In this way defects are produced in the zones of the three layers which have undergone implantation. Following this operation, the substrate undergoes a thermal annealing treatment under a hydrogen atmosphere at a temperature of 650° C. for 10 hours.

This leads to the formation of a tungsten silicide layer of formula $WSi_2$ coated with a $SiO_2$ layer on the substrate zones corresponding to the junction 24 to be produced and said junction is simultaneously coated with the isolating layer 25.

Under these conditions, on the substrate zones which have not undergone implantation, the tungsten silicide layer has not had sufficient time to form, because the diffusion rate between the tungsten and silicon atoms is too slow compared with the diffusion rate of said same atoms in the zones which have undergone implantation.

In order to obtain the junction 24 covered with layer 25, it is then sufficient to eliminate the tungsten and silicon in the substrate zones which have not undergone implantation and this can be carried out by wet—HF—NO$_3$H etching to eliminate the Si and then HCl—NO$_3$H for eliminating the W.

The thus obtained tungsten silicide layer of formula $WSi_2$ has a thickness of approximately 650 Å and a resistivity of approximately 100 $\mu\Omega$.cm.

In another example, the first amorphous hydrogenated silicon layer is deposited by silane decomposition from a mixture containing 10% $SiH_4$ and 90% hydrogen by glow discharge at 50 kHz and 300° C. at a deposition rate of approximately 133 Å/min for four minutes, which makes it possible to obtain a 54 nm thick amorphous hydrogenated silicon layer.

This is followed by the operations of depositing the amorphous hydrogenated tungsten layer, the amorphous hydrogenated silicon layer, ionic implantation and annealing under the same conditions as described hereinbefore.

This gives a tungsten silicide layer $WSi_2$ covered with a $SiO_2$ layer on the substrate zones corresponding to junction 24, which has a thickness and electrical resistivity equivalent to those obtained by deposition the first layer by reactive cathodic sputtering.

FIGS. 3 and 4 show the formation of a refractory metal silicide layer 24 on a substrate 18 by applying to the substrate successively the layers 24a, 24b and 24c described above and subjecting that structure to ionic implantation in the zone of layer 24 also as fully described above.

Thus, the process according to the invention is highly advantageous for the production of interconnection layers, because it does not require the use of high temperatures which could prejudice the physicochemical characteristics and electronic properties of the components already produced on the substrate. Moreover, it makes it possible to avoid the problems caused by the etching of a refractory metal silicide layer. It is simple to perform because it is possible to deposit the amorphous silicon layers and the amorphous refractory metal layer by cathodic sputtering, whereas the prior art processes require deposition operations under an ultrahigh vacuum.

Moreover, this process makes it possible to produce interconnection multi layers separated by silicon dioxide-based isolating layers. Thus, it is possible to obtain the deposition of the isolating oxide layer at the same time and the presence of the oxygen inhibits the formation of the silicide, which guarantees isolation between the metal silicide layers, even with very limited isolating layer thicknesses.

What is claimed is:

1. A process for the formation on a substrate of a tungsten or molybdenum silicide layer, wherein it comprises the following successive steps:
   (a) depositing on said substrate in the presence of hydrogen gas a first hydrogenated amorphous silicon layer,
   (b) depositing on said first layer in the presence of hydrogen gas a second hydrogenated amorphous tungsten or molybdenum metal layer,
   (c) depositing on said second layer in the presence of hydrogen gas a third hydrogenated amorphous silicon layer and,
   (d) subjecting the thus obtained coated substrate to an annealing treatment in a hydrogen atmosphere at a temperature equal or higher than 350° C. and for a time to achieve diffusion of silicon atoms into said metal to form said silicide layer and to obtain recrystallization of said silicide layer.

2. A process according to claim 1, wherein at least certain zones of the substrate covered with the three layers undergo ionic implantation using ions chosen from among the ions of refractory metal, silicon and elements not reacting either with the refractory metal or with the silicon, prior to carrying out annealing step d.

3. A process according to claim 2, wherein the ions are tungsten ions.

4. A process according to claim 2 or 3, wherein ionic implantation is carried out solely over certain zones of the substrate and wherein the thermal annealing treatment is carried out for a time such that said silicide layer is only formed on the substrate zones subjected to ionic implantation.

5. A process according to to claim 1 or 2, wherein said metal layer is tungsten, and the annealing treatment is performed at a temperature equal to or higher than 550° C.

6. A process according to claim 2, wherein the annealing treatment temperature is such that a said silicide layer coated with an isolating $SiO_2$ layer is formed.

7. A process according to claim 1, wherein the first and third amorphous hydrogenated silicon layers are deposited by reactive cathodic sputtering in the presence of hydrogen.

8. A process according to claim 7, wherein the first layer is deposited at a temperature between 30° and 350° C.

9. A process according to claim 7, wherein the third layer is deposited at ambient temperature.

10. A process according to claim 1, wherein the first amorphous hydrogenated silicon layer is formed by the decomposition of a gaseous mixture containing silane and hydrogen by glow discharge.

11. A process according to claim 10, wherein the gaseous mixture contains 10 to 100% silane.

12. A process according to claim 1 or 2, wherein said second.

13. A process according to claim 1 or 2 wherein said substrate comprises an integrated circuit and said silicide layer is an interconnection layer of said integrated circuit.

* * * * *